(12) United States Patent
Lee et al.

(10) Patent No.: US 8,258,691 B2
(45) Date of Patent: Sep. 4, 2012

(54) ORGANIC LIGHT EMITTING DISPLAY APPARATUS AND METHOD OF MANUFACTURING THE SAME

(75) Inventors: Sung-Soo Lee, Yongin (KR);
Chang-Woong Chu, Yongin (KR); Se-Il Kim, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 13/239,663

(22) Filed: Sep. 22, 2011

(65) Prior Publication Data

US 2012/0176025 A1     Jul. 12, 2012

(30) Foreign Application Priority Data

Jan. 10, 2011 (KR) .................. 10-2011-0002304

(51) Int. Cl.
*H01J 1/62* (2006.01)
(52) U.S. Cl. ...................... 313/504; 313/506
(58) Field of Classification Search .............. 313/498, 313/503, 504, 506
See application file for complete search history.

(56) References Cited

U.S. PATENT DOCUMENTS

| 7,825,584 B2 * | 11/2010 | Kim ........................ 313/504 |
| 2007/0102737 A1 | 5/2007 | Kashiwabara et al. |
| 2010/0156280 A1 | 6/2010 | Song et al. |

FOREIGN PATENT DOCUMENTS

| EP | 2230692 A1 * | 9/2010 |
| KR | 10-2006-0079225 | 7/2006 |
| KR | 10-2010-0071539 | 6/2010 |

* cited by examiner

*Primary Examiner* — Vip Patel
(74) *Attorney, Agent, or Firm* — Robert E. Bushnell, Esq.

(57) ABSTRACT

An organic light emitting display apparatus using a micro cavity method comprises a first sub pixel, a second pixel and a third pixel, each of which emits different color from an emission layer interposed between two electrodes. The first sub pixel, the second sub pixel and the third sub pixel form a unit pixel. Emission layers of the first and second sub pixels are formed so as to have the same pattern throughout the first and second sub pixels, and an emission layer of the third sub pixel is formed so as to have a pattern separate from the first and second sub pixels. In this structure, three-colored emission layers may be formed using two mask processes so that productivity is improved due to process simplification, and high-resolution is realized due to a decrease in the distance between deposited patterns.

17 Claims, 4 Drawing Sheets

ORGANIC LIGHT EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Jan. 10, 2011 and there duly assigned Serial No. 10-2011-0002304.

BACKGROUND OF THE INVENTION

1. Field of the Invention

The present invention relates to an organic light emitting display apparatus, and more particularly, to an organic light emitting display apparatus which is improved by reducing the number of uses of a mask when manufacturing an emission layer, and a method of manufacturing the same.

2. Description of the Related Art

In general, organic light emitting display apparatuses have wide viewing angles, excellent contrast, and rapid response speed relative to other display apparatus.

The organic light emitting display apparatus may realize a color in such a way that holes injected from an anode and a cathode are recombined in an emission layer, wherein the organic light emitting display apparatus has a stack structure in which the emission layer is interposed between a pixel electrode, as an anode, and an opposed electrode, as a cathode.

A unit pixel of the organic light emitting display apparatus includes sub pixels such as red pixel, green pixel, and a blue pixel, and these three-colored sub pixels are combined to realize a desired color. In other words, an emission layer which emits any one of red, green, and blue is interposed between two electrodes in each sub pixel, and a color of the unit pixel is represented by an appropriate combination of the three colors.

The emission layer may be formed using mask deposition in such a way that a mask having a pattern which is the same as a pattern of the emission layer is arranged on an object material, and a raw material is deposited through the mask so that an emission layer having a desired pattern is formed on the object material.

However, in order to deposit the mask, a mask may be changed each time when each sub pixel, such as red, green, and blues, is formed so that a total of three mask processes is needed. For example, when a red sub pixel, a green sub pixel and a blue sub pixel are deposited, a first mask, a second mask and a third mask may be used, respectively, so as to complete a pattern of an emission layer in a unit pixel.

Then, the mask processes increase, and thus productivity may be reduced. Also, a distance of about at least 25 µm is needed between emission layers of colors adjacent each other during mask deposition for smooth deposition. Thus, an increase in the mask processes causes an obstruction for realizing high resolution. In this regard, appropriate resolutions are required.

SUMMARY OF THE INVENTION

The present invention provides an organic light emitting display apparatus which is improved by reducing the number of uses of a mask so as to easily improve productivity and to realize high resolution, and a method of manufacturing the same.

According to an aspect of the present invention, an organic light emitting display apparatus comprises a first sub pixel, a second pixel, and a third pixel, each of which emits different color from an emission layer interposed between two electrodes, the first sub pixel, the second sub pixel, and the third sub pixel forming a unit pixel. Emission layers of the first sub pixel and the second sub pixel are formed so as to have the same pattern throughout the first sub pixel and the second sub pixel, and an emission layer of the third sub pixel is formed so as to have a pattern separate from the first sub pixel and the second sub pixel.

The distance between two electrodes of the first sub pixel may be different from the distance between two electrodes of the second sub pixel.

The first sub pixel and the second sub pixel may include a mixed emission layer which represents a first color and a second color which are different from each other due to a difference in the distance between the two electrodes, and the third sub pixel may include a separate emission layer which represents a third color which is different from the first color and the second color.

The mixed emission layer may include a first emission layer which represents the first color and a second emission layer which represents the second color, the first emission layer and the second emission layer being stacked as different layers.

The mixed emission layer may include a single layer which represents the first color and the second color.

The first color may be red, the second color may be green, and the third color may be blue.

The first sub pixel, the second sub pixel, and the third sub pixel may each include a pixel electrode and an opposed electrode as the two electrodes, and the first sub pixel or the second sub pixel may further include a gap adjusting electrode in the pixel electrode so as to vary the difference between the two electrodes.

The gap adjusting electrode may include amorphous indium tin oxide (ITO).

The pixel electrode may include a silver (Ag) alloy layer and a crystalline ITO layer.

The pixel electrode may further include an $SiN_x$ layer or an $SiO_x$ layer.

According to another aspect of the present invention, a method of manufacturing an organic light emitting display apparatus comprises: forming a pixel electrode of each of a first sub pixel, a second sub pixel and a third sub pixel, the first sub pixel, the second sub pixel and the third sub pixel forming a unit pixel further forming a gap adjusting electrode in the pixel electrode of the first sub pixel or the pixel electrode of the second sub pixel; forming a mixed emission layer which represents a first color and a second color, and which has the same pattern throughout the first sub pixel and the second sub pixel; forming a separate emission layer in the third sub pixel which represents a third color and which has a pattern separate from the first sub pixel and the second sub pixel; and forming an opposed electrode facing each of the pixel electrodes of the first sub pixel, the second sub pixel, and the third sub pixel.

The forming of the mixed layer may include stacking a first emission layer which represents the first color and a second emission layer which represents the second color as different layers.

The forming of the mixed layer may include forming a single layer which represents the first color and the second color.

The first color may be red, the second color may be green, and the third color may be blue.

The gap adjusting electrode may include amorphous ITO.

The pixel electrode may include a silver (Ag) alloy layer and a crystalline ITO layer.

The pixel electrode may further include an $SiN_x$ layer or an $SiO_x$ layer.

In the organic light emitting display apparatus, three-colored emission layers may be formed using two mask processes so that productivity may be improved due to process simplification, and high-resolution may be realized due to a decrease in the distance between deposited patterns.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, one or more embodiments of the present invention will be described in detail with reference to the accompanying drawings.

Figure 1:
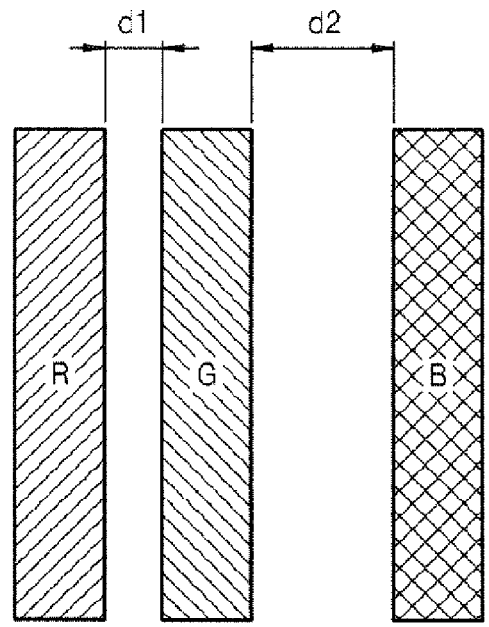
FIG. 1 is a plan view schematically illustrating a unit pixel of an organic light emitting display apparatus according to an embodiment of the present invention.

FIG. 1 is a plan view schematically illustrating a unit pixel of an organic light emitting display apparatus according to an embodiment of the present invention.

More specifically, FIG. 1 illustrates three colors of sub pixels forming a unit pixel of an organic light emitting display apparatus according to an embodiment of the present invention.

Referring to FIG. 1, the unit pixel includes three colors of sub pixels such as a red (R) sub pixel, a green (G) sub pixel, and a blue (B) sub pixel. In the organic light emitting display apparatus, unit pixels including the three colors of sub pixels are repeatedly arranged along row and column directions.

In the latter regard, a distance d1 between the red (R) sub pixel and the green (G) sub pixel may be shorter than a distance d2 between the blue (B) sub pixel and the green (G) sub pixel. Such a structure may be obtained since emission layers of the red (R) sub pixel and the green (G) sub pixel are formed so as to have the same pattern in a single mask process. In other words, as described above, at least 25 µm of distance is needed between emission layers of colors adjacent to each other during mask deposition for smooth deposition. Thus, the distance d1 between the blue (B) sub pixel and the green (G) sub pixel, wherein emission layers thereof are formed using a separate mask process, may be maintained at about 25 µm. However, since the emission layers of the red (R) sub pixel and the green (G) sub pixel are formed so as to have the same pattern in a single mask process, a distance of about 25 µm may not be secured. Accordingly, the distance d1 may be decreased. The resolution may increase due to the decrease in a distance between pixels, thereby realizing high-definition. The emission layers of the red (R) and green (G) sub pixels having the same mask pattern, and the emission layer of the blue (B) sub pixel having a separate mask pattern, will be described in detail later.

Figure 2:
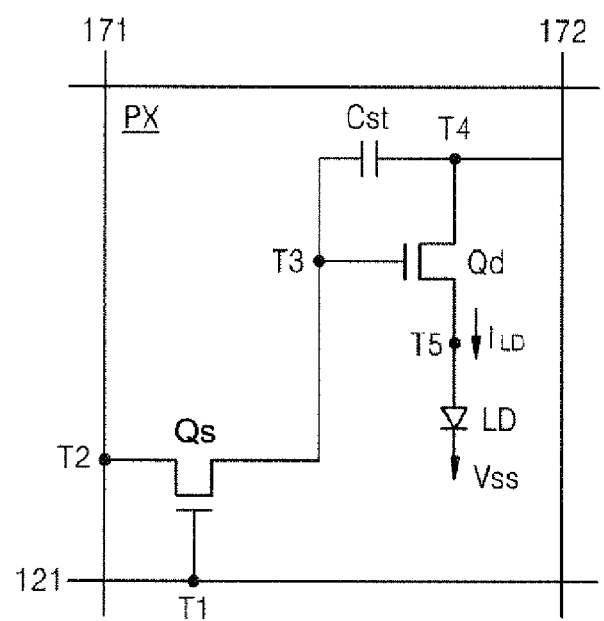
FIG. 2 is an equivalent circuit diagram of one sub pixel from the unit pixel of FIG. 1.

FIG. 2 is an equivalent circuit diagram of one sub pixel from the unit pixel of FIG. 1.

More specifically, FIG. 2 is an equivalent circuit diagram of one sub pixel PX from red (R), green (G) and blue (B) sub pixels which form the unit pixel of FIG. 1.

As illustrated in FIG. 2, the sub pixel PX is connected to a plurality of signal lines 121, 171 and 172.

The plurality of signal lines 121, 171 and 172 include a scanning signal line 121 for transmitting a gate signal (or scanning signal), a data line 171 for transmitting a data signal, and a driving voltage line 172 for transmitting a driving voltage.

The sub pixel PX includes a switching transistor Qs, a driving transistor Qd, a storage capacitor Cst, and an organic light emitting device (LD).

The switching transistor Qs includes a control terminal T1, an input terminal T2, and an output terminal T3, wherein the control terminal T1 is connected to the scanning signal line 121, the input terminal T2 is connected to the data line 171, and the output terminal T3 is connected to the driving transistor Qd. The switching transistor Qs transmits a data signal received from the data line 171 to the driving transistor Qd in response to a scanning signal received from the scanning signal line 121.

The driving transistor Qd includes a control terminal T3, an input terminal T4, and an output terminal T5, wherein the control terminal T3 is connected to the switching transistor Qs, the input terminal T4 is connected to the driving voltage line 172, and the output terminal T5 is connected to the organic light emitting device (LD). The output terminal T3 of the switching transistor Qs is the control terminal T3 of the driving transistor Qd, and an output current ILD, which varies according to a voltage applied between the control terminal T3 and the output terminal T5, flows.

The storage capacitor Cst is connected between the control terminal T3 and the input terminal T4 of the driving transistor Qd. The storage capacitor Cst charges a data signal applied to the control terminal T3 of the driving transistor Qd, and maintains the data signal after the switching transistor Qs is turned off.

The organic light emitting device LD includes a pixel electrode connected to the output terminal T5 of the driving transistor Qd, an opposed electrode connected to a common voltage Vss, and an emission layer interposed between the pixel electrode and the opposed electrode, and light is emitted in the emission layer due to a voltage between the two electrodes.

The structure of the organic light emitting device LD is described in detail with reference to FIG. 3A.

Figure 3A:
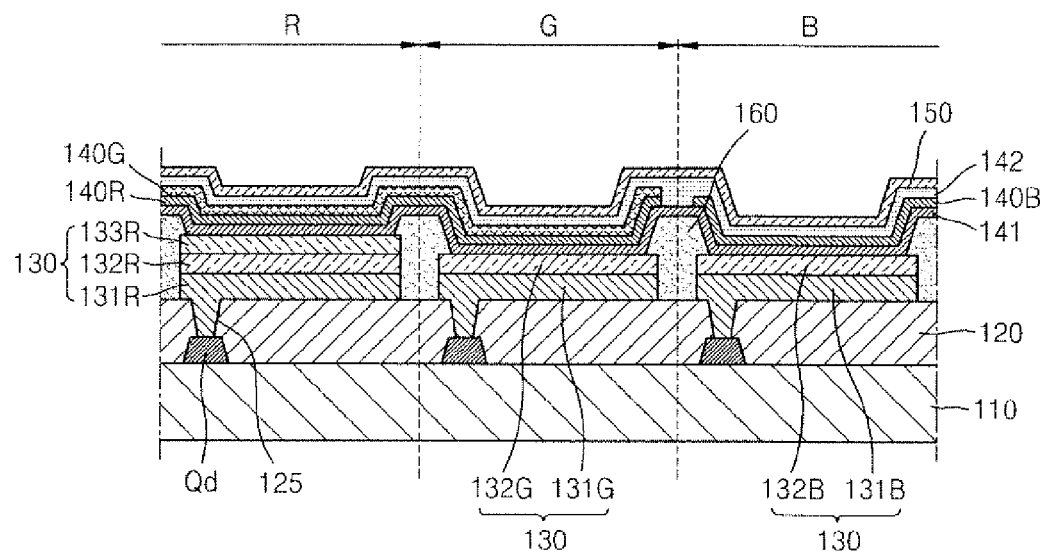
FIG. 3A is a cross-sectional view of the unit pixel of FIG. 1.
Figure 3B:
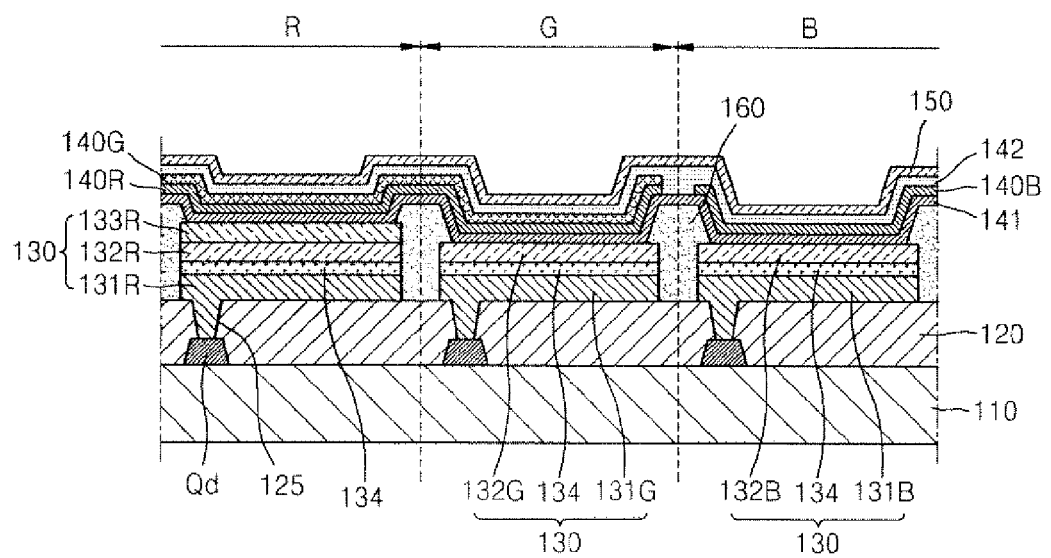
FIGS. 3B thru 3D are cross-sectional views of modifiable unit pixels illustrated in FIG. 3A.
Figure 3C:
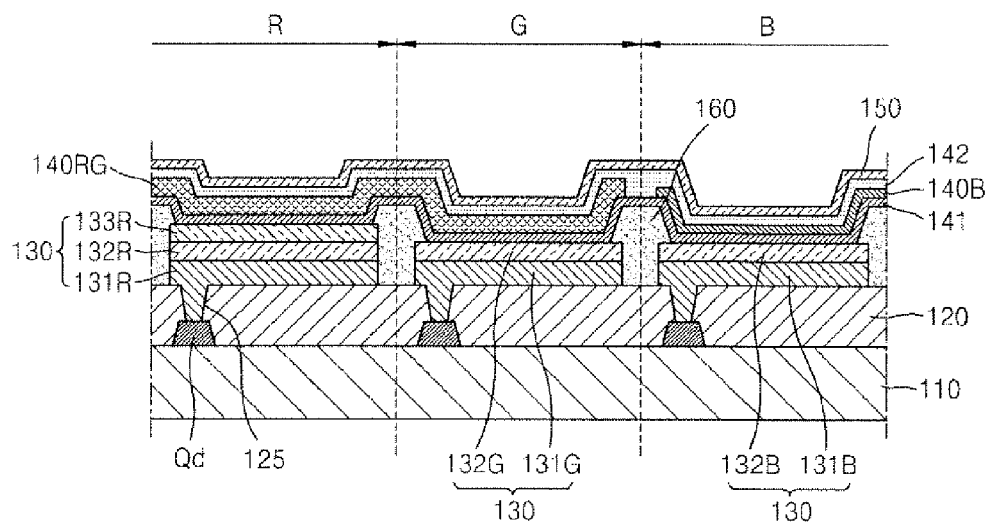
Figure 3D:
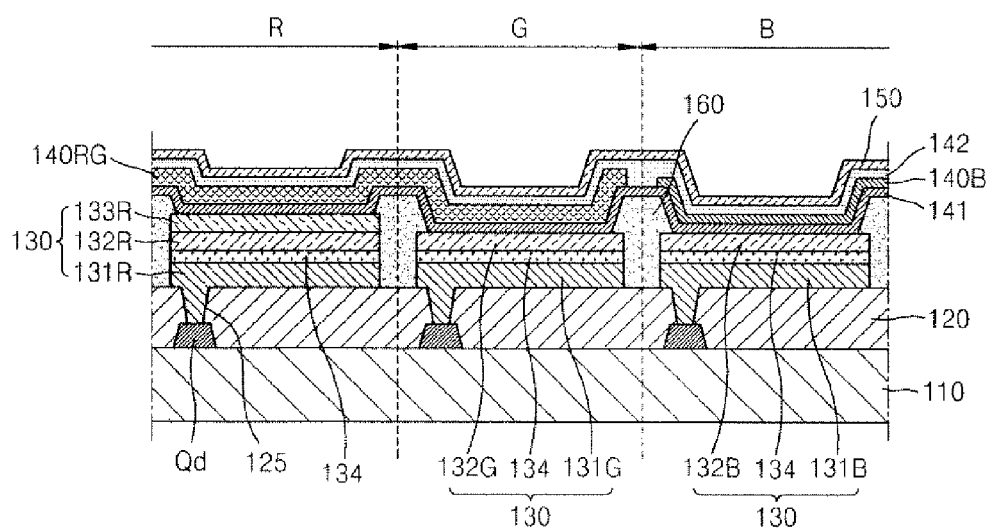
Figure 4:
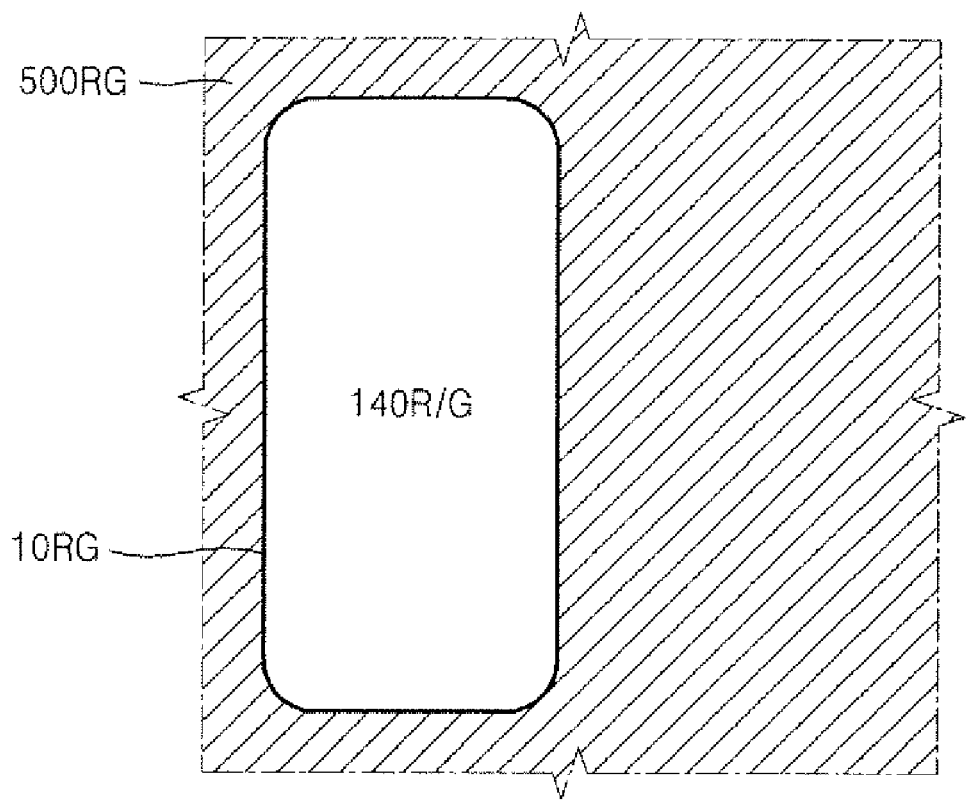
FIG. 4 illustrates a mask used when forming an emission layer of red and green sub pixels from the unit pixel of FIG. 1.

FIG. 3A is a cross-sectional view of the unit pixel of FIG. 1; FIGS. 3B thru 3D are cross-sectional views of modifiable unit pixels illustrated in FIG. 3A; and FIG. 4 illustrates a mask used when forming an emission layer of red and green sub pixels from the unit pixel of FIG. 1.

Specifically, FIG. 3A includes red (R), green (G) and blue (B) sub pixels in the organic light emitting display apparatus.

As illustrated in FIG. 3A, a plurality of driving transistors Qd are formed on an insulating substrate 110 which is formed of transparent glass or plastic. Although not illustrated, the switching transistor Qs and the plurality of signal lines 121, 171, and 172 are formed on the insulating substrate 110.

A protective layer 120, consisting of an inorganic material or an organic material, is formed on the driving transistors Qd and contact holes 125 for exposing the driving transistors Qd are formed in the middle of the protective layer 120.

Pixel electrodes 130 of red (R), green (G) and blue (B) sub pixels formed on the protective layer 120 include silver (Ag) alloy layers 131R, 131G, and 131B, respectively, as a semi permeable or reflective electrode, and crystalline ITO layers 132R, 132G and 132B, respectively, as a conductive oxide member.

Also, an amorphous ITO layer 133R is further formed on the pixel electrode 130 of the red (R) sub pixel as a gap adjusting electrode. The gap adjusting electrode 133R is added so as to vary the distance between two electrodes of the red (R) sub pixel and the green (G) sub pixel, that is, the pixel electrode 130 and an opposed electrode 150. Due to the gap adjusting electrode 133R, even if an emission layer 140R of the red (R) sub pixel and an emission layer 140G of the green (G) sub pixel are formed so as to have the same mask pattern, each colored light may be emitted, as will be described in detail later.

An insulating member 160 is formed between the pixel electrodes 130.

The emission layer 140R of the red (R) sub pixel, the emission layer 140G of the green (G) sub pixel, and the emission layer 140B of the blue (B) sub pixel are formed between a hole injection layer 141 and an electron injection layer 142.

Here, the emission layer 140B of the blue (B) sub pixel is formed as a separate emission layer through a separate mask process. In other words, the blue emission layer 140B is formed as an emission layer separate from the red (R) and green (G) sub pixels.

However, the emission layers 140R and 140G of the red (R) sub pixel and the green (G) sub pixel, respectively, are formed so as to have the same pattern through a single mask pattern. In other words, as illustrated in FIG. 3A, the red emission layer 140R is first formed throughout the red (R) sub pixel and the green (G) sub pixel, and then the green emission layer 140G is formed on the red emission layer 140R with the same pattern. Thus, the red and green emission layers 140R and 140B, respectively, are continuously deposited through a same pattern 10RG of a single mask 500RG, as illustrated in FIG. 4, and thus a mixed emission layer, in which the red emission layer 140R and the green emission layer 140G are sequentially formed, is formed throughout the red (R) sub pixel and the green (G) sub pixel. Then, two emission layers 140R and 140G of the red (R) sub pixel and the green (G) sub pixel, respectively, may be formed using the single mask 500RG, and thus the number of mask processes may be reduced as compared with a general mask process in which the number of masks are used in each colored emission layer. Accordingly, operations may be simplified and, as described above, the red (R) sub pixel and the green (G) sub pixel are deposited in the same mask process so that the distance between the red (R) sub pixel and the green (G) sub pixel may not be 25 μm or above, and thus it is easy to realize high-resolution.

The opposed electrode 150 transmits the common voltage Vss, and a sealing layer (not illustrated) for preventing penetration of moisture and oxygen may be further formed on the opposed electrode 150.

In the organic light emitting display apparatus, an image is displayed using a micro cavity method which causes interference by sending light back and forth between the pixel electrode 130 and the opposed electrode 150.

That is, light emitted from the emission layers 140R, 140G, and 140B transmits back and forth between the pixel electrode 130 and the opposed electrode 150 so as to cause constructive interference or destructive interference, and thus the intensity of light increases or decreases. Here, conditions for the distance between the pixel electrode 130 and the opposed electrode 150, in which constructive interference is easily caused in each colored light, vary. In other words, the distance between the pixel electrode 130 and the opposed electrode 150, which allows constructive interference, is in proportion to wavelength of light. Thus, if the distance is set appropriately for each color, strengthened light may be realized. Also, in order to use the micro cavity method, the pixel electrode 130 or the opposed electrode 150, where an image is realized, is a semi permeable electrode, and the other is a total reflective electrode. Such semi permeable or total reflective characteristics may be obtained by reducing or increasing the thickness of an electrode, even in a metal material.

The emission layer 140B of the blue (B) sub pixel is formed as a separate emission layer, separated from the red (R) and green (G) sub pixels, and thus the distance between the pixel electrode 130 and the opposed electrode 150 is set so that constructive interference is individually caused. The distance between the pixel electrode 130 and the opposed electrode 150 may be set by, for example, adjusting the thickness of the emission layer 140B.

In the red (R) and green (G) sub pixels, the emission layers 140R and 140B are formed so as to have the same pattern throughout the red (R) and green (G) sub pixels. Here, constructive interference of red light may be caused in the red (R) sub pixel and constructive interference of green light may be caused in the green (G) sub pixel. In this regard, the gap adjusting electrode 133R is added to the red (R) sub pixel.

That is, since the gap adjusting electrode 133R is added, the distance between the pixel electrode 130 and the opposed electrode 150, where constructive interference occurs between the red (R) sub pixel and the green (G) sub pixel, varies. Accordingly, although the red and green emission layers 140R and 140G are formed so as to have the same pattern throughout the red (R) sub pixel and the green (G) sub pixel, the gap adjusting electrode 133R is used to vary the distance between the pixel electrode 130 and the opposed electrode 150, and thus constructive interference of red light and constructive interference of green light may easily occur in the red (R) sub pixel and the green (G) sub pixel, respectively. In the current embodiment of the present invention, when the gap adjusting electrode 133R does not exist, constructive interference of green light easily occurs, and destructive interference of red light occurs in the red (R) sub pixel and the green (G) sub pixel. When the gap adjusting electrode 133R exists, constructive interference of red light easily occurs, and destructive interference of green light occurs in the red (R) sub pixel and the green (G) sub pixel. In other words, the gap adjusting electrode 133R is added to make a condition of the constructive interference and the destructive interference such that the distance between the pixel electrode 130 and the opposed electrode 150 is fixed.

Then, although the red and green emission layers 140R and 140G, respectively, exist in the red (R) and green (G) sub pixels as a mixed emission layer, red light and green light may be emitted from the red (R) sub pixel and the green (G) sub pixel.

A method of manufacturing the organic light emitting display apparatus described above may be briefly described as follows. In general, the protective layer 120, the insulating member 160, the hole injection layer 141, and the electron injection layer 142 are sequentially formed in the insulating substrate 110, and thus other elements will be described.

Firstly, the pixel electrodes 130 of red (R), green (G), and blue (B) sub pixels, which form a unit pixel, are formed on the insulating substrate 110.

Here, the emission layers 140R and 140G are formed so as to have the same pattern throughout the red (R) and green (G) sub pixels, and thus the gap adjusting electrode 133R, used to vary the distance between the pixel electrode 130 and the opposed electrode 150, is additionally formed in the pixel electrode 130 of the red (R) sub pixel.

Then, a mixed emission layer, in which the red emission layer 140R and the green emission layer 140G are sequentially formed, is formed so as to have the same pattern 10RG by the single mask 500 RG of FIG. 4 throughout the red (R) and green (G) sub pixels.

Then, the blue emission layer 140B is formed in the blue (B) sub pixel as a separate emission layer, separate from the red (R) and green (G) sub pixels.

Next, the opposed electrode 150 facing the pixel electrodes 130 is formed.

According to the method of manufacturing the organic light emitting display apparatus, the emission layers 140R and 140G of the red (R) sub pixel and the green (G) sub pixel, respectively, may be formed using a single mask process. Thus, three-colored emission layers may be formed using two times the mask process so that the manufacturing process may be simplified, and it is easy to realize high-resolution.

Hereinafter, a modifiable organic light emitting display apparatus will be described.

The organic light emitting display apparatus of FIG. 3B is substantially the same as the organic light emitting display apparatus of FIG. 3A. However, a transparent oxide layer such as a $SiN_x$ or $SiO_x$ layer 134 may be further formed in the pixel electrodes 130 in FIG. 3B. That is, the $SiN_x$ or $SiO_x$ layer 134 may be formed in the pixel electrodes 130 in adjusting the distance between the two electrodes so that light of the corresponding color may cause constructive interference. Other structures and effects are the same as in the previous embodiment.

The organic light emitting display apparatus of FIG. 3C is substantially the same as the organic light emitting display apparatus of FIG. 3A. However, the emission layers 140R and 140G of the red (R) and green (G) sub pixels are formed as a single layer, instead of separate layers, in FIG. 3D. That is, a mixed emission layer 140RG is formed as a single layer by depositing a mixed material, in contrast to FIG. 3A in which the red emission layer 140R and the green emission layer 140G are sequentially formed. In this case, in the red (R) sub pixel and the green (G) sub pixel, constructive interference and destructive interference occur due to a difference in distance between the pixel electrode 130 and the opposed electrode 150, and red light and green light may be emitted from the red (R) sub pixel and the green (G) sub pixel, respectively. Other structures and effects are the same as in the previous embodiment.

In FIG. 3D, a transparent oxide layer such as the $SiN_x$ or $SiO_x$ layer 134 is further formed in the pixel electrodes 130. That is, the $SiN_x$ or $SiO_x$ layer 134 may be formed in the pixel electrodes 130 in adjusting the distance between the two electrodes so that light of the corresponding color may cause constructive interference. Other structures and effects are the same as in the previous embodiment.

Accordingly, an organic light emitting display apparatus having a simplified manufacturing process and high-resolution may be realized.

In the previous embodiments, the blue emission layer 140B is formed as a separate emission layer which does not contact the red (R) sub pixel and the green (G) sub pixel, and may be formed to cover, for example, the emission layers 140R, 140G, and 140RG of the red (R) sub pixel and the green (G) sub pixel, respectively. However, in the red (R) sub pixel and the green (G) sub pixel, remaining two colors except for its own color may not be offset, and thereby the intensity of light is relatively decreased, even if the same voltage is applied. Accordingly, the blue emission layer 140B may be formed as a separate emission layer.

Also, the red (R), green (G), and blue (B) sub pixels may be represented as first, second, and third sub pixels, respectively. That is, the gap adjusting electrode 133R does not need to be in the red (R) sub pixel, and the blue sub pixel (B) does not need to have a separate emission layer. In other words, in the present invention, one sub pixel from among three sub pixels may include a separate emission layer, and a mixed emission layer of two sub-pixels may be formed using a single mask process.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light emitting display apparatus, comprising:
   a first sub pixel, a second pixel and a third pixel, each of which emits a different color from an emission layer interposed between two electrodes, wherein the first sub pixel, the second sub pixel and the third sub pixel form a unit pixel; and
   wherein emission layers of the first sub pixel and the second sub pixel are formed so as to have a same pattern throughout the first sub pixel and the second sub pixel, and an emission layer of the third sub pixel is formed so as to have a pattern separate from the first sub pixel and the second sub pixel.

2. The organic light emitting display apparatus of claim 1, wherein a distance between two electrodes of the first sub pixel is different from a distance between two electrodes of the second sub pixel.

3. The organic light emitting display apparatus of claim 2, wherein the first sub pixel and the second sub pixel comprise a mixed emission layer which represents a first color and a second color which are different from each other due to a difference in a distance between the two electrodes, and the third sub pixel comprises a separate emission layer which represents a third color which is different from the first color and the second color.

4. The organic light emitting display apparatus of claim 3, wherein the mixed emission layer comprises a first emission layer which represents the first color and a second emission layer which represents the second color, the first emission layer and the second emission layer being stacked as different layers.

5. The organic light emitting display apparatus of claim 3, wherein the mixed emission layer comprises a single layer which represents the first color and the second color.

6. The organic light emitting display apparatus of claim 3, wherein the first color is red, the second color is green, and the third color is blue.

7. The organic light emitting display apparatus of claim 2, wherein each of the first sub pixel, the second sub pixel and the third sub pixel comprises a pixel electrode and an opposed electrode as the two electrodes, and one of the first sub pixel and the second sub pixel further comprises a gap adjusting electrode in the pixel electrode so as to vary the distance between the two electrodes.

8. The organic light emitting display apparatus of claim 7, wherein the gap adjusting electrode comprises amorphous indium tin oxide (ITO).

9. The organic light emitting display apparatus of claim 7, wherein the pixel electrode comprises a silver (Ag) alloy layer and a crystalline ITO layer.

10. The organic light emitting display apparatus of claim 9, wherein the pixel electrode further comprises one of an $SiN_x$ layer and an $SiO_x$ layer.

11. A method of manufacturing an organic light emitting display apparatus, the method comprising the steps of:

forming a pixel electrode of each of a first sub pixel, a second sub pixel and a third sub pixel, wherein the first sub pixel, the second sub pixel and the third sub pixel form a unit pixel;

further forming a gap adjusting electrode in one of the pixel electrode of the first sub pixel and the pixel electrode of the second sub pixel;

forming a mixed emission layer which represents a first color and a second color, and which has a same pattern throughout the first sub pixel and the second sub pixel;

forming a separate emission layer in the third sub pixel which represents a third color, and which has a pattern separate from the first sub pixel and the second sub pixel; and forming an opposed electrode facing each of the pixel electrodes of the first sub pixel, the second sub pixel and the third sub pixel.

12. The method of claim 11, wherein the step of forming the mixed emission layer comprises stacking a first emission layer which represents the first color and a second emission layer which represents the second color as different layers.

13. The method of claim 11, wherein the step of forming the mixed layer comprises forming a single layer which represents the first color and the second color.

14. The method of claim 11, wherein the first color is red, the second color is green, and the third color is blue.

15. The method of claim 11, wherein the gap adjusting electrode comprises amorphous ITO.

16. The method of claim 11, wherein the pixel electrode comprises a silver (Ag) alloy layer and a crystalline ITO layer.

17. The method of claim 11, wherein the pixel electrode further comprises one of an $SiN_x$ layer and an $SiO_x$ layer.

\* \* \* \* \*